(12) United States Patent
Schumacher

(10) Patent No.: US 6,546,444 B2
(45) Date of Patent: Apr. 8, 2003

(54) TUNED STUB, SCSI TOPOLOGY

(75) Inventor: Matthew J. Schumacher, Cypress, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 09/989,051

(22) Filed: Nov. 20, 2001

(65) Prior Publication Data

US 2002/0032824 A1 Mar. 14, 2002

Related U.S. Application Data

(60) Provisional application No. 60/231,384, filed on Sep. 8, 2000.

(51) Int. Cl.⁷ .............................................. G06F 13/40
(52) U.S. Cl. ........................ 710/300; 710/305; 326/30
(58) Field of Search ........................ 710/300, 62, 305, 710/2, 301, 313, 100; 712/32, 35; 711/114; 714/6; 333/22 R; 326/30, 21, 101; 709/250, 203, 253; 370/257, 901, 908; 361/778, 685, 686

(56) References Cited

U.S. PATENT DOCUMENTS

| | | | | |
|---|---|---|---|---|
| 5,467,453 A | * | 11/1995 | Kocis | |
| 5,571,996 A | * | 11/1996 | Swamy et al. | |
| 5,613,074 A | * | 3/1997 | Gallowway | |
| 6,108,740 A | * | 8/2000 | Caldwell | |
| 6,425,025 B1 | * | 7/2002 | Kamepalli | |

* cited by examiner

*Primary Examiner*—Gopal C. Ray
(74) *Attorney, Agent, or Firm*—Conley Rose, P.C.

(57) ABSTRACT

A tuned stub, SCSI topology is disclosed. More particularly, a SCSI bus comprises a plurality of SCSI load stubs, a pair of SCSI terminators, a plurality of traces electrically connecting the SCSI load stubs between the SCSI terminators, and a plurality of tuning stubs. The tuning stubs are positioned at predetermined locations on the plurality of traces and have predetermined lengths such that they are capable of filtering noise on the SCSI bus.

41 Claims, 5 Drawing Sheets

TUNED STUB, SCSI TOPOLOGY

This Application claims the benefit of No. 60/231,384, filed Sep. 8, 2000.

BACKGROUND OF THE INVENTION

1. Field of the Invention

The present invention pertains to buses and, more particularly, to the use of tuned stubs in a SCSI bus.

2. Description of the Related Art

Computer systems typically comprise many discrete parts that communicate electronic data and control information among the various discrete parts. The communication occurs over one or more "buses." A bus is a collection of wires or traces over which the data and control information is communicated among the computer's discrete parts. The wires are usually collected into "connectors," or female/male combinations of plugs. Whether a bus includes a collection of wires, a collection of traces, or both, depends on the nature of the discrete parts and their location in the computer system. Typically, a bus will include, at least at some level, both wires and traces. Thus, a bus is a collection of traces and/or wires, perhaps including connectors, over which multiple discrete parts of a computer system communicate by sharing signals.

For instance, the computer's discrete parts typically include one or more printed circuit boards ("PCBs") having multiple integrated circuit components and connectors mounted to them. These components are frequently referred to as "devices." Exemplary types of devices include, but are not limited to, processors (e.g., microprocessors, digital signal processors, and micro-controllers), memory devices (e.g., hard disk drives, floppy disk drives, and optical disk drives), and peripheral devices (e.g., keyboards, monitors, mice). When electrically connected to a bus, these types of devices, as well as others not listed, are all sometimes generically referred to as "bus devices." A PCB with components mounted thereto is frequently referred to as a printed circuit assembly ("PCA").

The components and connectors are interconnected by and communicate with each other over traces etched into the board. The boards are interconnected by plugging one or more of the boards into another board intended for this purpose. A first component on a board communicates with a second component on the same board over the traces etched onto the board. The first component communicates with a component on another board through the connectors by which the two boards are plugged into the third board intended for that purpose. Thus, both the traces on the boards and the connectors between the boards are a part of the bus.

These traces over which components communicate are "buses." Buses are usually constructed and operate in accordance with one or more "standards." Standards are usually set by groups of industry representatives and specify the physical and operational characteristics of the bus. Physical characteristics range from the number of loads (e.g., the number of bus devices) to the spacing between boards. The physical and operational characteristics of a bus interrelate highly.

One such bus standard is the Small Computer System Interface ("SCSI", pronounced "scuzzy"). There are actually many different kinds of SCSI, each defined by a different SCSI standard. More particularly, at least the following varieties of SCSI are currently implemented: SCSI-1, SCSI-2, Wide SCSI, Fast SCSI, Fast Wide SCSI, Ultra SCSI, SCSI-3, Ultra Wide SCSI, Ultra2 SCSI, Fibre Channel, and Wide Ultra2 SCSI as well as some buses utilizing optical interconnections. Thus, in actuality, there are several SCSI standards and they are not necessarily compatible with each other, although the basic SCSI standards (SCSI-1, SCSI-2, and SCSI-3) are basically functionally compatible. On the other hand, one problem with these standards is that it is hard in many cases to draw the line between them.

Generally, SCSI began as a parallel interface standard used by Apple Macintosh computers, PCs, and many UNIX systems for attaching peripheral devices to computers. The original intent was to develop an interface providing faster data transmission rates (up to 80 megabytes per second) than the standard serial and parallel ports found on computers of the time. However, the SCSI standards proved to be enormously more useful than this original intent. One distinct advantage to the SCSI interface was that it permitted a user to attach many devices to a single SCSI port. The conventional serial and parallel ports of the time generally were limited to one device per port. SCSI consequently presented numerous advantages, and, not surprisingly many of these greatly facilitated the attachment of peripheral devices for input/output ("I/O") purposes. So, SCSI really was an I/O bus rather than simply an interface.

The various SCSI standards showed still more versatility and have been adapted to large scale computing environments, including networks, both local area networks ("LANs") and wide area networks ("WANs"). One large scale computing application is the implementation of redundant arrays of inexpensive disks ("RAIDs"), which uses multiple arrays of multiple disks to improve performance and enhance reliability. A RAID is essentially a large storage device, and typically interfaces with a server or other computing device. In this circumstance, both the RAID and the other computing device may both be implemented using SCSI buses, although this is certainly not required.

As with all areas of computing technology, consumer demand continually pushes for ever increasing performance. The standards setting process is rather slow compared to technological innovation responsive to this push. Thus, existing standards frequently challenge designers charged with wresting higher performance while maintaining compatibility with the standards. For instance, signal integrity frequently becomes a greater concern at higher performance levels because there is less margin for error. One difficulty with signal integrity is the "signal-to-noise" ratio. If the bus includes too much traffic unrelated to the signal, i.e., "noise," the signal can become corrupted or indecipherable. A signal propagating down a SCSI bus, for example, will encounter a number of stubs, or interconnections, among a variety of boards and components. A portion of the signal is reflected each time the signal encounters such a stub, and this reflection is "noise." Thus, the more interconnections on the bus, the greater the noise and, consequently, the greater the threat to signal integrity.

The present invention is directed to resolving, or at least reducing, one or all of the problems mentioned above.

SUMMARY OF THE INVENTION

The invention comprises a tuned stub, SCSI topology. More particularly, a SCSI bus comprises a plurality of SCSI load stubs, a pair of SCSI terminators, a plurality of traces electrically connecting the SCSI load stubs between the SCSI terminators, and a plurality of tuning stubs. The tuning stubs are positioned at predetermined locations on the plurality of traces and have predetermined lengths such that they are capable of filtering noise on the SCSI bus.

BRIEF DESCRIPTION OF THE DRAWINGS

The invention may be understood by reference to the following description taken in conjunction with the accompanying drawings, in which like reference numerals identify like elements, and in which.

Figure 1:
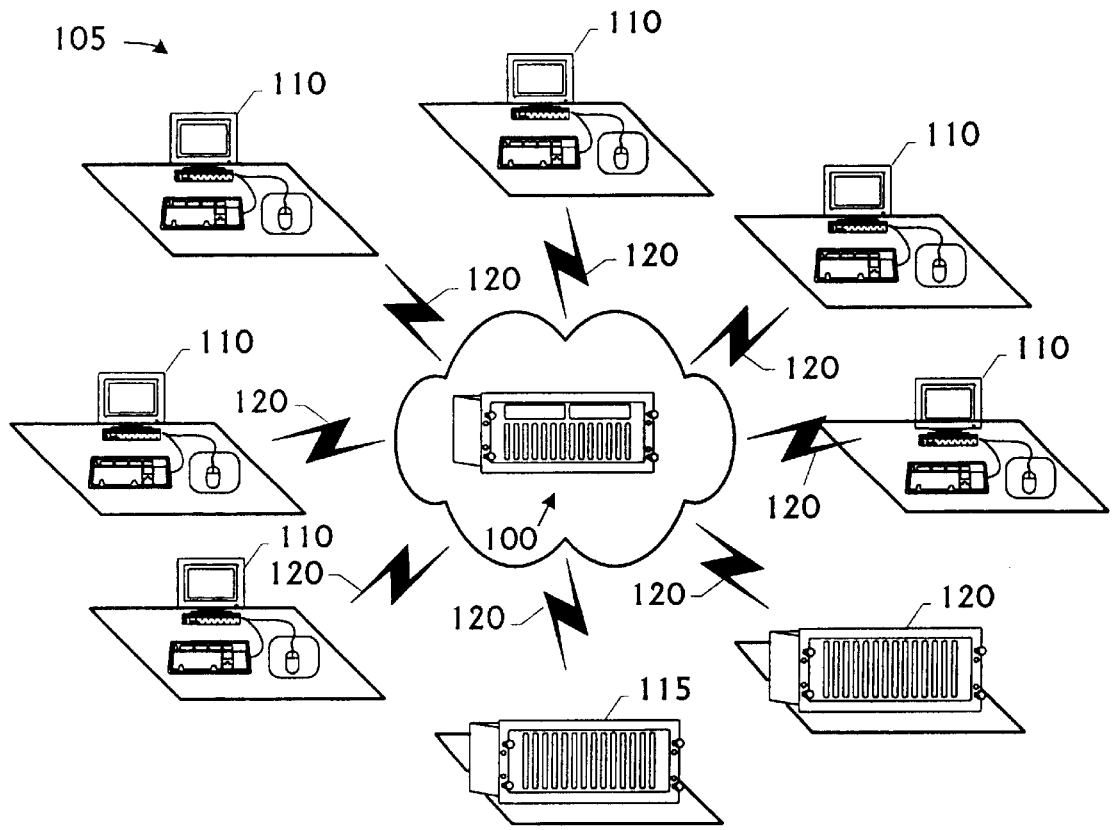
FIG. 1 conceptually illustrates a computing apparatus constructed and operated in accordance with the present invention comprising a portion of a larger computing system.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort, even if complex and time-consuming, would be a routine undertaking for those of ordinary skill in the art having the benefit of this disclosure.

FIG. 1 illustrates one particular embodiment of a computing apparatus 100 constructed and operated in accordance with the present invention in the context of a larger computing system 105. The computing system 105 may be a local area network ("LAN"), a wide area network ("WAN"), a system area network ("SAN"), an intranet, or even a portion of the Internet. The computing system 105 implements a client/server architecture, with the computing apparatus 100 providing the server function for the computing system 105. The clients 110 in the illustrated embodiment are workstations employing a Windows™-based operating system (e.g., a Windows™NT or 2000 operating system).

However, the invention is not so limited. The computing system 100 may implement a peer-to-peer architecture instead of a client/server architecture. The clients 110 may be implemented in virtually any type of electronic computing apparatus such as a notebook computer, a desktop computer, a mini-computer, a mainframe computer, or a supercomputer. The clients 110 may also employ operating systems that are not Windows™-based, such as a UNIX™ or DOS ("disk operating system")-based operating system, for example. The communications links 120 over which the server 100 and the clients 110 communicate may be twisted wire pairs, coaxial cable, optical fiber, or some other suitable transmission medium known to the art. In some embodiments, the communications links 120 may even be wireless. The communications links 120 may implement any suitable communications protocol, e.g., TCP/IP. The invention is not limited by these aspects of any given implementation.

Figure 2:
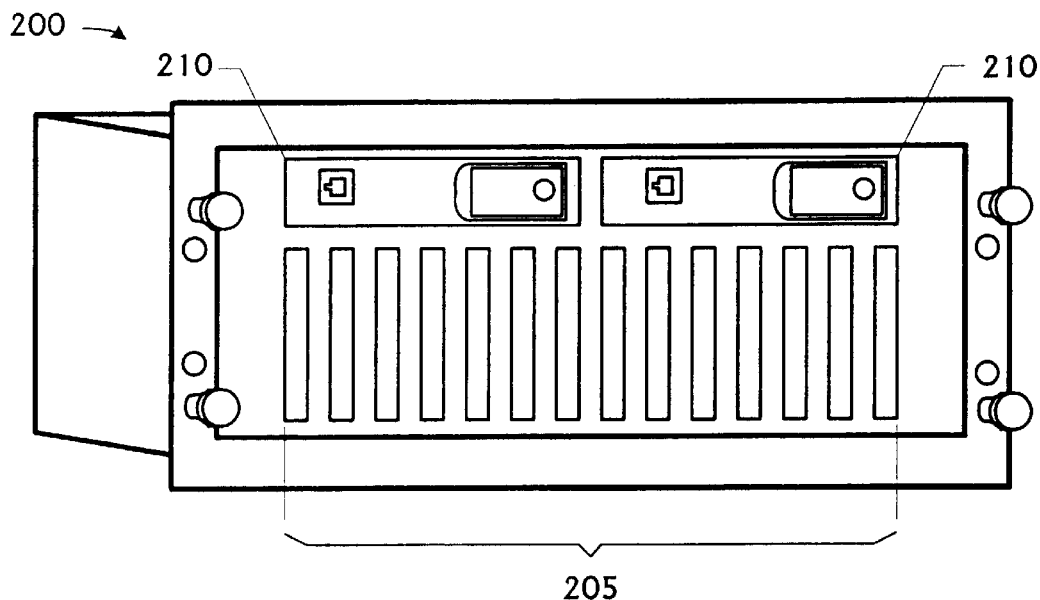
FIG. 2 is a conceptualized, isometric, mechanical drawing of the computing apparatus of FIG. 1.

Turning now to FIG. 2, the computing apparatus 100, in the illustrated embodiment, is a rack-mounted, cluster storage unit. The illustrated embodiment of the computing apparatus 100 includes fourteen SCSI disk drives 205, two RAID array controllers 210, and a SCSI I/O PCA (not shown). However, the invention is not limited by the types or numbers of such components. For instance, a second embodiment includes, in addition to the components previously listed, two additional RAID array controllers 210, a Fibre Channel switchboard PCA (not shown), and a Fibre channel controller PCA (not shown) that piggybacks onto the RAID controllers 210. Other types of components may be used in alternative embodiments in addition to, or in lieu of those set forth above.

In accordance with its function as a storage unit, the computing apparatus 100 is also connected to an external storage unit 115, shown in FIG. 1, sometimes commonly referred to as Just a Bunch of Disks ("JBOD"). The computing apparatus may, in some embodiments, also be connected to a mass storage unit 120. The RAID controllers 210 and SCSI disks drives 205 (shown in FIG. 2), in conjunction with the external storage unit 115, form a "direct attached storage" subsystem. This direct attached storage subsystem is "local" to the server function of the computing apparatus 100 in that only the server function of the computing apparatus 100 can read and write to it. Other servers in the computing system 105 (not shown) are unable to talk to this direct attached storage subsystem. However, the mass storage unit 120 may be a "shared" memory subsystem, i.e., other servers in the computing system 105 may read and write to it in addition to the server function of the computing apparatus 100.

Figure 3:
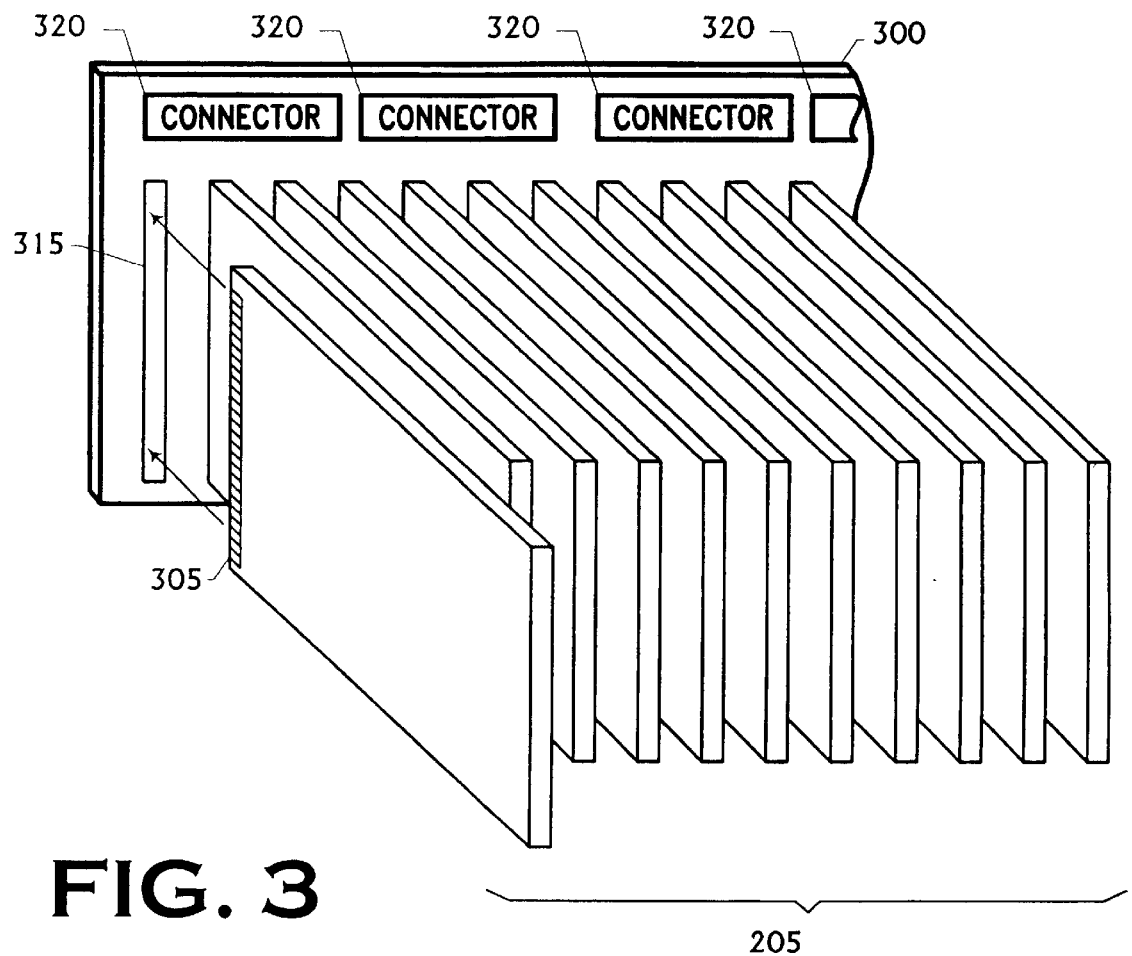
FIG. 3 illustrates the backplane and several boards of the apparatus in FIG. 1 in a partially exploded, isometric view.

As is shown in FIG. 3, the computing apparatus 100 includes backplane 300 providing an interconnection among a plurality of boards, or cards, such as the SCSI disk drives 205 and the RAID controllers 210 (shown in FIG. 2). As will be appreciated by those skilled in the art having the benefit of this disclosure, the SCSI disk drives 205 and the RAID controllers 210 are PCAs that may be generically referred to as "boards," or "cards." The interconnection(s) may be implemented in any suitable manner known to the art, e.g., the gold finger edge connector 305. The backplane 300 is primarily passive, containing mostly connectors such as the connectors 315, only one of which is shown in FIG. 3, and the connectors 320. Note that, in the illustrated embodiment, the connectors 315 are gold finger receptacles capable of mating with the gold finger edge connectors 305. A plurality of SCSI disk drives 205 and RAID controllers 210 are interconnected to the backplane 300 by the connectors 315, 320, respectively. The connectors 315, 320 are SCSI connectors.

Returning to the two implementations, the SCSI buses (not shown in FIG. 2) were routed such that the RAID controllers were electrically on opposite ends of the SCSI bus and the disk drives were "biased" toward one end of the SCSI bus. This layout caused excessive noise of the SCSI electrical clock and data signals to be excessive and degrade signal integrity. This distortion produced data errors and/or data transmission failures. The distortion was mitigated by adding multiple "tuned stubs" in selected locations in the layout of the SCSI bus on the backplane 200 in accordance with the present invention. These tuned stubs dampen the noise and improve overall signal integrity. The design and operation of these tuned stubs shall now be disclosed.

Figure 4:
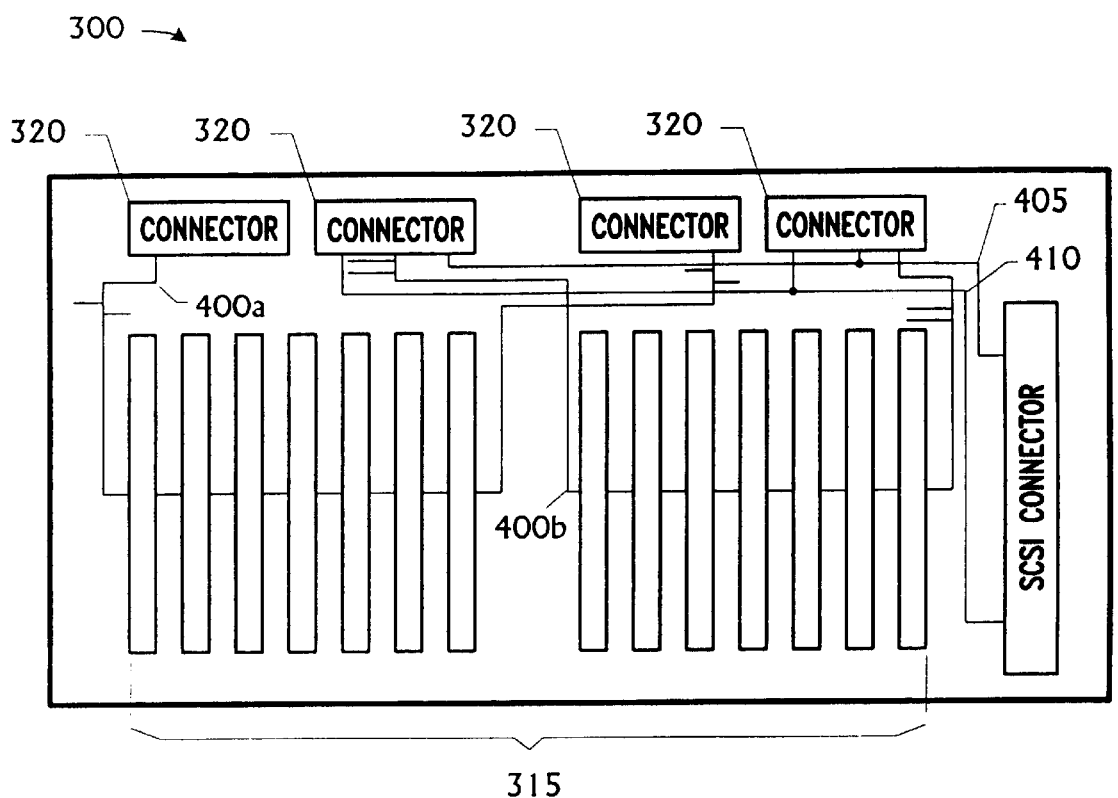
FIG. 4 is a plan view of the backplane of FIG. 3, conceptually illustrating a plurality of SCSI buses thereon in accordance with the present invention.

FIG. 4 conceptually illustrates a plurality of SCSI buses on the backplane 300. As will be appreciated by those skilled in the art, the backplane 300 contains a number of additional details not shown in FIG. 4. These details are omitted for the sake of clarity and so as not to obscure the invention since they are not pertinent to the present invention. Indeed, the present invention is implemented in only two of the SCSI buses shown, those being SCSI buses 400a and 400b. Two other SCSI buses 405, 410 interconnect the RAID controllers 210, shown in FIG. 2, to a SCSI connector 410, not previously shown. The SCSI connector 410 provides, through a SCSI I/O PCA (not shown), a connection to, e.g., the external storage unit 115 or the mass storage unit 120, both shown in FIG. 1. In various embodiments, the invention may be employed in any given SCSI bus regardless of whether other SCSI buses in the same computing apparatus employ the invention.

The backplane 300 actually comprises several layers of traces separated by insulating material and copper planes electrically interconnected by vias in accordance with conventional practice. Thus, although the SCSI buses 400a, 400b are illustrated as being on the same plane of the backplane 300 (i.e., the surface), various pieces of the SCSI buses 400a, 400b are actually found on various layers within the backplane 300 and are electrically interconnected by vias. This will be typical for most implementations, although it is possible that the entire SCSI bus 400a, 400b might be located on the same signal layer, even the surface, of the backplane 300 in various implementations. However, the SCSI buses 400a, 400b are shown on the same signal layer of the backplane 300 for clarity and ease of illustration in FIG. 4.

Figure 5:
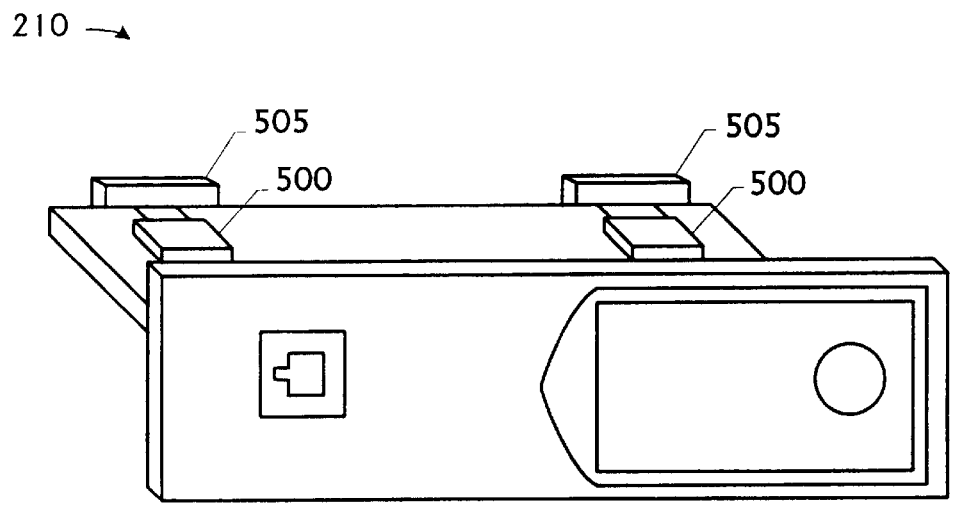
FIG. 5 depicts one particular implementation of a RAID controller from the embodiment of the computing apparatus illustrated in FIG. 1 in an assembled, isometric view.

As is shown in FIG. 5, each RAID controller 210 includes two SCSI protocol chips 500, electrically connected to SCSI connectors 505 that mate with the SCSI connectors 320, shown first in FIG. 3. Thus, each RAID controller 210 is interconnected to the backplane 300 by two sets of SCSI connectors 320, 505. Each of the. SCSI protocol chips 500 is capable of terminating a SCSI bus, e.g., the SCSI buses 400a, 400b, 405, 410, in accordance with the SCSI protocols. The SCSI protocol chips 500 can be any suitable SCSI protocol chip known to the art.

Figure 6C:
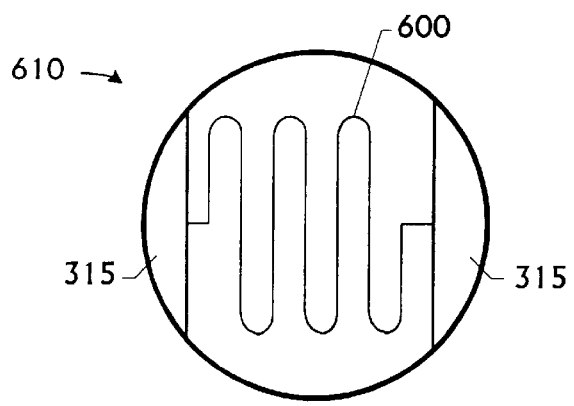
FIG. 6A, FIG. 6B, and FIG. 6C illustrate certain aspects of selected SCSI buses in the computing apparatus of FIG. 1 and FIG. 2.
Figure 6A:
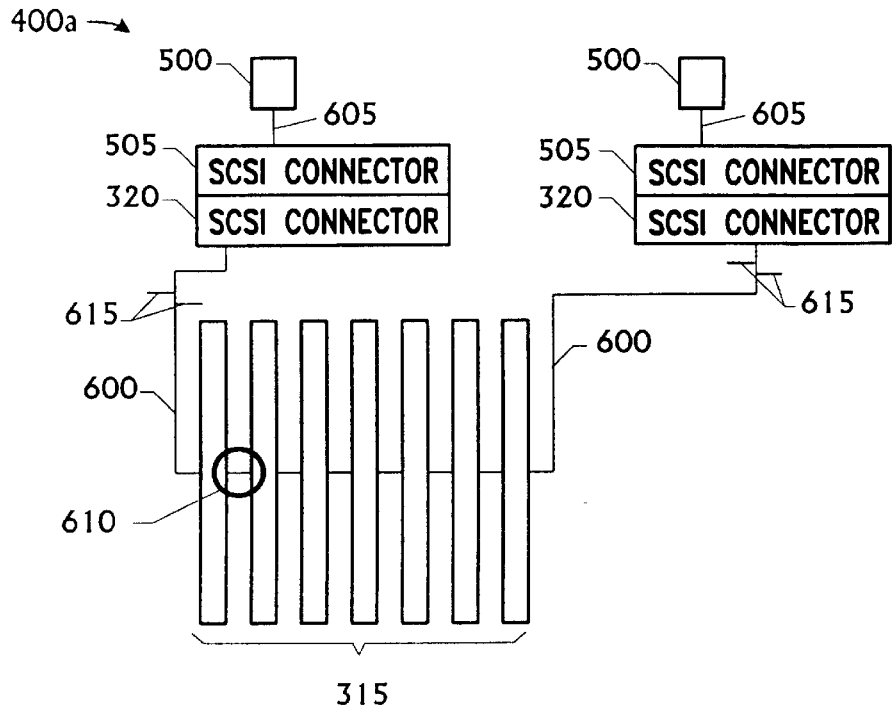
Figure 6B:
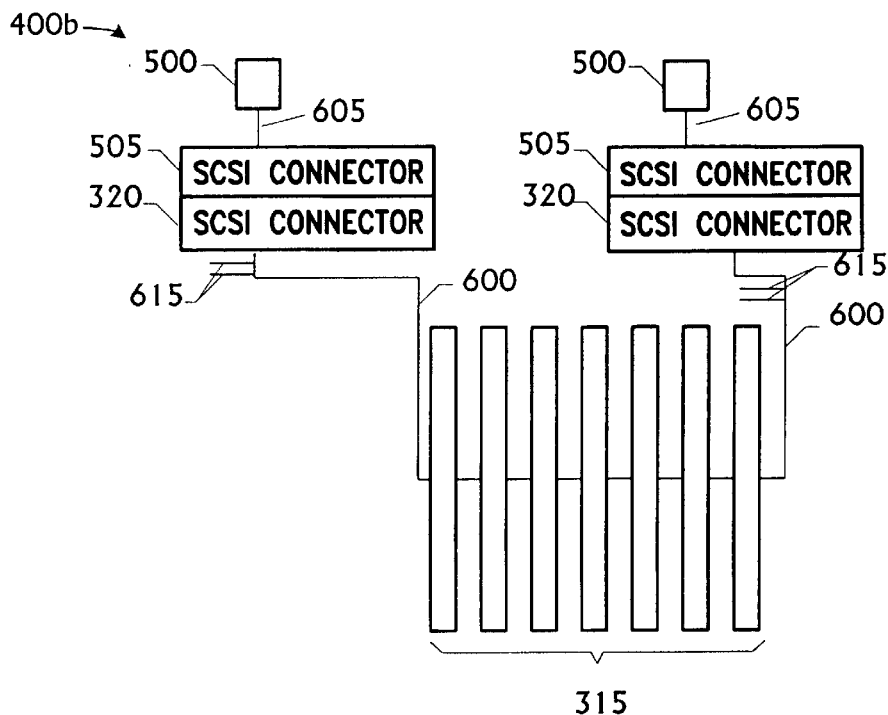

The SCSI buses 400a, 400b, are conceptually illustrated in their entirety in FIG. 6A and FIG. 6B, respectively. Each of the SCSI buses 400a, 400b is terminated on each end by a SCSI protocol chip 500 located on a RAID controller 210. The SCSI buses 400a, 400b, therefore include not only the traces 600 and SCSI connectors 315 on the backplane 300, but also the SCSI connectors 320, 505, the traces 605 on the RAID controller 210, and the SCSI protocol chips 500 on the RAID controller 210.

One of the ways in which the buses 400a, 400b are conceptualized in FIG. 6A and in FIG. 6B is that the do not show the full "net length," or "electrical length," of the buses 400a, 400b. There is a distinction between the "net length" or "electrical length" of the trace between adjacent devices, and the "physical space," i.e., an "as the crow flies" distance between adjacent devices. In some implementations, these two lengths may be the same, but that is not the typical case. The electrical length of a bus usually varies from the physical spacing in order to control certain electrical characteristics of the bus.

Also, the wave of the electrical signal may propagate in different velocities on the various levels of the backplane 300, depending on the dielectric environment presented by those levels through which the signal propagates. In the illustrated embodiment, efforts were made to maintain the dielectric environment consistently across the various levels of the backplane 300. Thus, the electrical or net lengths illustrated can be directly compared to other lengths not shown but within the same embodiment.

For instance, the detail 610 in FIG. 6A is enlarged in FIG. 6C to illustrate one technique by which the electrical length of the bus 400a is longer than the physical space. As is shown in FIG. 6C, the trace 600 of the bus 400a, to control the electrical length of the trace 400a—and, hence, certain electrical characteristics thereof—may be formed in a serpentine pattern between the two SCSI connectors 315. This technique is employed to varying degrees on each of the traces 600 of the buses 400a, 400b between each of the SCSI connectors 315. This and other techniques for controlling the electrical length of SCSI buses are well known in the art are may be employed in conjunction with the present invention. For example, various portions of the trace 600 may be placed on different layers of the backplane 300 to control not only the electrical length of the bus 400a, 400b, but also the electrical impedance at that point of the trace 600.

As is best shown in FIG. 6A and FIG. 6B, each of the buses 400a, 400b includes a pair of tuning stubs 615 at either end thereof that filter traffic on the buses 400a, 400b. These tuning stubs 615 may be referred to as "tuning" stubs because they are "tuned" by positioning them on the buses 400a, 400b and adjusting their lengths such that they filter noise from signal traffic on the buses 400a, 400b. As those in the art having the benefit of this disclosure will appreciate, the connectors 315 also are "stubs" on the buses 400a, 400b. In the context of the present invention, they may be referred to as "load" stubs to distinguish them from the tuning stubs 615.

As will be appreciated by those skilled in the art, as signals propagate over the bus 400a, 400b, portions of those signals are reflected at each impedance discontinuity it encounters, e.g., the SCSI connectors 315. These discontinuities generate the noise mentioned above and degrade the performance of the computing apparatus 100. The tuned stubs 615 filter the noise from the traffic on the buses 400a, 400b to improve the signal-to-noise ratio and, thereby, improve performance of the buses 400a, 400b as a whole. Note that using two tuning stubs 615 at either end, as opposed to one, increases the bandwidth of the filtering performed by the tuning stubs 615, such that less demanding applications may be able to use only a single tuning stub 615 at either end.

The efficiency with which the tuning stubs 615 filter the noise turns on the positioning of the tuning stubs 615, as well as other stubs, such as the connectors 315, on the buses 400a, 400b, and the length of the tuning stubs 615. The placement and length of the tuning stubs 615 will be implementation specific, depending on a number of factors. Exemplary factors include, but are not limited to the:

the base frequency of the signals on the bus;
the edge rate of the signals and, hence, the signal components on the bus;
impedance discontinuities on the bus
electrical loads on the bus; and
the dielectric component through which the signal propagates.

Note that some of these factors are not constant, but may vary over time. For instance, a signal deteriorates with the variance in the electrical loading introduced by SCSI devices (not shown) on the SCSI buses 400a, 400b, the routing of the traces 600, and the particular implementation of the connectors 315. Thus, as the computing apparatus 100 is reconfigured over its operating life, SCSI devices may be added or removed, thereby altering the electrical loading therefrom on the SCSI buses 400a, 400b. Also, the loading may vary at different portions of the SCSI buses 400a, 400b. For instance, one or more of the connectors 315 might be empty, so that there is no electrical loading from SCSI devices, but other connectors 315 might be used, so that SCSI devices electrically load the buses 400a, 400b at that point. The noise margin will therefore vary with the variable population of the loads. Thus, dual tuning stubs 615 were employed in the illustrated embodiment to employ a wider filtering capacity.

Figure 7:
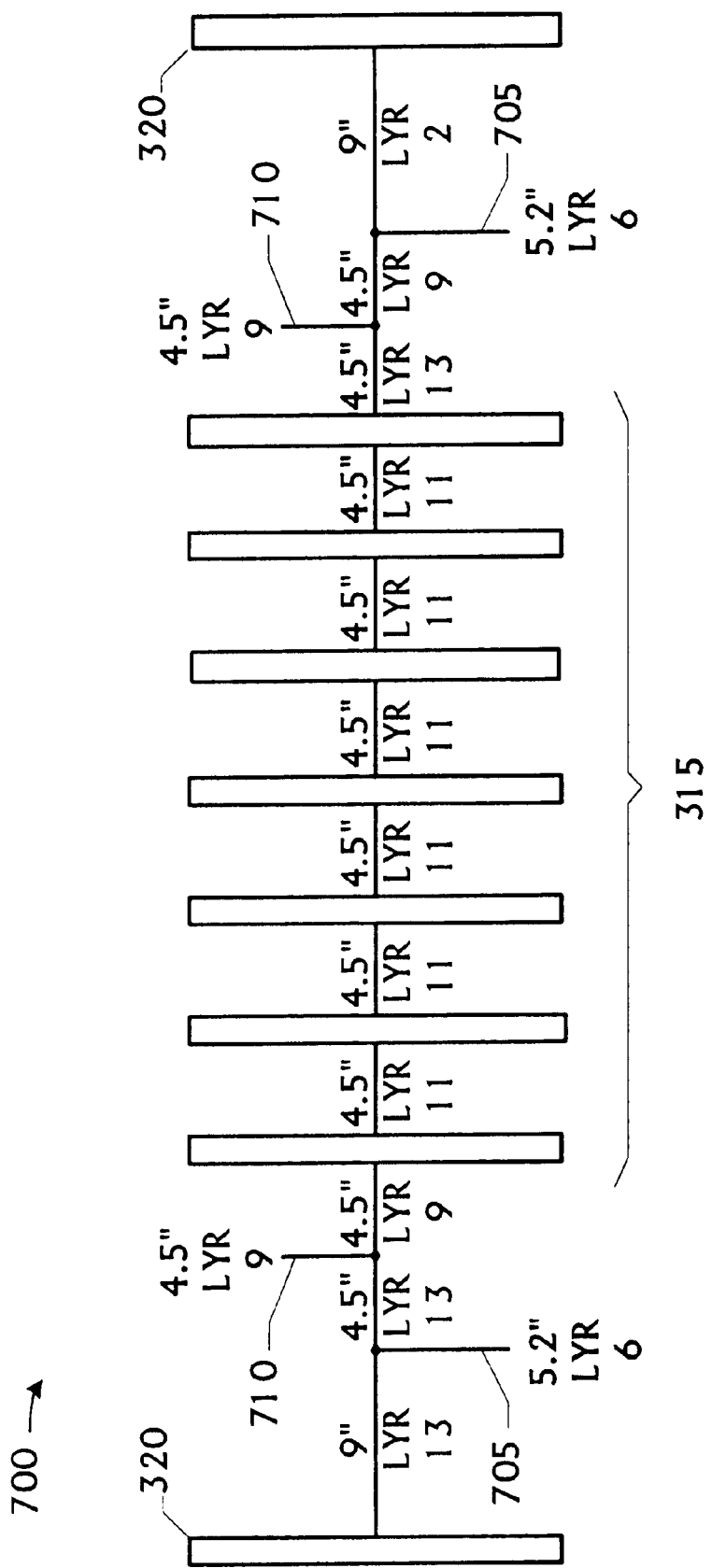
FIG. 7 illustrates a portion of one particular implementation of the SCSI buses in FIG. 6A and FIG. 6B.

FIG. 7 conceptually illustrates a portion 700 of a SCSI bus, e.g., the buses 400a, 400b, implementing a tuned stub topology in accordance with the present invention. The portion 700 is tuned for signals having a frequency of 40 MHz and an edge rate of 1 nanosecond.. The portion comprises 16 traces of such bus including seven SCSI connectors 315 and a SCSI connector 320 at either end. As will be appreciated by those skilled in the art, the bus from which the portion 700 is taken is terminated, e.g., by the terminators 510, not shown in FIG. 7. Each of the SCSI connectors 315 is separated from adjacent SCSI connectors 315 by a trace portion having an electrical length of 4.5" on the eleventh layer of a board, e.g., the backplane 300.

Between the outermost SCSI connectors 315 and the SCSI connectors 320, two tuning stubs 705, 710 are disposed. The tuning stubs 705 are located at an electrical length of 9" from the SCSI connectors 315 by trace portions on the thirteenth and second layers of the board, respectively, and at an electrical length of 4.5" from tuning stubs 710 by trace portions on the thirteenth and ninth layers of the board, respectively. The tuning stubs 710 are positioned at an electrical length of 4.5" from the outermost SCSI connectors 315 by trace portions on the ninth and thirteenth layers of the board, respectively. All electrical lengths are measured pin-to-pin. The tuning stubs 705, 710 have electrical lengths of 5.2" and 4.5", respectively, on the sixth and ninth layers of the board, respectively.

Note that the illustrated embodiment is designed for a low voltage differential ("LVD") SCSI implementation—hence the 40 MHz base frequency and 1 nanosecond edge rate. As those in the art having the benefit of this disclosure will appreciate, different SCSI implementations and standards may employ different base frequencies and edge rates. As was mentioned above, base frequency and edge rate are factors in positioning the tuning stubs 615. Other implementations under different SCSI standards would therefore use different stub lengths and separations for the tuning stubs 615 even if employed on the same backplane 300. LVD SCSI also employs differential signaling and, hence, all tuned stubs 615 are actually paired stubs. The present invention is not, however, limited to application with LVD SCSI and may be employed with other types of SCSI buses.

The positions and lengths of the tuning stubs 705, 710 in the portion 700 were experimentally determined through computerized simulation of the bus from which it is taken. The simulations were performed using an HSPICE simulation program well known in the art and available from:

Avant! Corporation

46871 Bayside Parkway

Fremont, Calif. 94538

USA phone: 510.413.8000 fax: 510.413.8080

<http://www.avanticorp.com>

The HSPICE modeling program was loaded onto an AlphaServer DS 20, dual processor computer available from:

Compaq Computer Corporation

P.O. Box 692000

Houston, Tex. 77269-2000

USA phone: 281-370-0670 fax: 281-514-1740 http: http://www.compaq.com>

After obtaining SPICE models for the devices from the vendor, a netlist was drafted to model the structure and operation of the bus in accordance with conventional modeling techniques commonly employed with the HSPICE simulation program. A succession of values for the various electrical lengths for the trace portions to see which yielded the "best" performance under anticipated operating conditions with anticipated "typical" configurations.

This concludes the detailed description. The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A SCSI bus, comprising:
   a plurality of SCSI load stubs;
   a pair of SCSI terminators;
   a plurality of traces electrically connecting the SCSI load stubs between the SCSI terminators; and
   a plurality of tuning stubs positioned at predetermined distances between each of the SCSI terminators and the SCSI load stubs electrically proximate thereto and having predetermined lengths.

2. The SCSI bus of claim 1, wherein the plurality of tuning stubs include:

a first and a second tuning stub positioned at a first and a second predetermined distance, respectively, from a first one of the SCSI terminators and before SCSI connector electrically proximate the first one of the SCSI terminators and having first and second predetermined lengths, respectively; and a third and a fourth tuning stub positioned at a third and a fourth predetermined distance, respectively, from a second one of the SCSI terminators and having third and fourth predetermined lengths, respectively.

3. The SCSI bus of claim 1, wherein the plurality of tuning stubs include:

a first tuning stub positioned on the SCSI bus at a first predetermined distance from an outermost load stub at a first end of the SCSI bus and having a first predetermined length;

a second tuning stub positioned on the SCSI bus at a second predetermined distance from the first tuning stub and a third predetermined distance from the a first one of the SCSI terminators at the first end of the SCSI bus and having a second predetermined length;

a third tuning stub positioned on the SCSI bus at a fourth predetermined distance from an outermost load stub at a second end of the SCSI bus and having a third predetermined length; and a fourth tuning stub positioned on the SCSI bus at a fifth predetermined distance from the third tuning stub and a sixth predetermined distance from a second one of the SCSI terminators on the second end of the SCSI bus and having a fourth predetermined length.

4. The SCSI bus of claim 3, wherein at least one of:

the first predetermined distance equals the second predetermined distance;

the fourth predetermined distance equals the fifth predetermined distance; and the third predetermined distance equals the sixth predetermined distance.

5. The SCSI bus of claim 1, wherein:

the SCSI load stubs and tuning stubs reside on a first board; and the SCSI terminators reside on a second board.

6. The SCSI bus of claim 5, wherein the first board is a backplane.

7. The SCSI bus of claim 5, wherein the second board is a RAID controller.

8. The SCSI bus of claim 1, wherein the SCSI terminators comprise SCSI protocol chips.

9. The SCSI bus of claim 1, wherein the SCSI bus comprises a low voltage differential SCSI bus.

10. A computing apparatus, comprising:

a backplane;

a plurality of SCSI loads; and a SCSI bus interconnecting the SCSI loads across the backplane, wherein the SCSI bus includes:
a plurality of SCSI load stubs;
a pair of SCSI terminators;
a plurality of traces electrically connecting the SCSI load stubs between the SCSI terminators; and
a plurality of tuning stubs positioned at predetermined distances between each of the SCSI terminators and the SCSI load stubs electrically proximate thereto and having predetermined lengths.

11. The computing apparatus of claim 10, wherein the plurality of tuning stubs include:

a first and a second tuning stub positioned at a first and a second predetermined distance, respectively, from a first one of the SCSI terminators and before SCSI connector electrically proximate the first one of the SCSI terminators and having first and second predetermined lengths, respectively; and a third and a fourth tuning stub positioned at a third and a fourth predetermined distance, respectively, from a second one of the SCSI terminators and having third and fourth predetermined lengths, respectively.

12. The computing apparatus of claim 10, wherein the plurality of tuning stubs include:

a first tuning stub positioned on the SCSI bus at a first predetermined distance from an outermost load stub at a first end of the SCSI bus and having a first predetermined length;

a second tuning stub positioned on the SCSI bus at a second predetermined distance from the first tuning stub and a third predetermined distance from the a first one of the SCSI terminators at the first end of the SCSI bus and having a second predetermined length;

a third tuning stub positioned on the SCSI bus at a fourth predetermined distance from an outermost load stub at a second end of the SCSI bus and having a third predetermined length; and a fourth tuning stub positioned on the SCSI bus at a fifth predetermined distance from the third tuning stub and a sixth predetermined distance from a second one of the SCSI terminators on the second end of the SCSI bus and having a fourth predetermined length.

13. The computing apparatus of claim 10, wherein:

the SCSI load stubs and tuning stubs reside on the backplane; and the SCSI terminators reside on a second board.

14. The computing apparatus of claim 10, wherein the SCSI bus comprises a low voltage differential SCSI bus.

15. A computing system, comprising:

a first computing apparatus including:
a backplane;
a plurality of SCSI loads; and
a SCSI bus interconnecting the SCSI loads across the backplane, wherein the SCSI bus includes:
a plurality of SCSI load stubs;
a pair of SCSI terminators;
a plurality of traces electrically connecting the SCSI load stubs between the SCSI terminators; and
a plurality of tuning stubs positioned at predetermined distances between each of the SCSI terminators and the SCSI load stubs electrically proximate thereto and having predetermined lengths.

at least other computing apparatus electrically communicating with the first computing apparatus.

16. The computing system of claim 15, wherein the plurality of tuning stubs include:

a first and a second tuning stub positioned at a first and a second predetermined distance, respectively, from a first one of the SCSI terminators and before SCSI connector electrically proximate the first one of the SCSI terminators and having first and second predetermined lengths, respectively; and a third and a fourth tuning stub positioned at a third and a fourth predetermined distance, respectively, from a second one of the SCSI terminators and having third and fourth predetermined lengths, respectively.

17. The computing system of claim 15, wherein the plurality of tuning stubs include:

a first tuning stub positioned on the SCSI bus at a first predetermined distance from an outermost load stub at a first end of the SCSI bus and having a first predetermined length;

a second tuning stub positioned on the SCSI bus at a second predetermined distance from the first tuning stub and a third predetermined distance from the a first one of the SCSI terminators at the first end of the SCSI bus and having a second predetermined length;

a third tuning stub positioned on the SCSI bus at a fourth predetermined distance from an outermost load stub at a second end of the SCSI bus and having a third predetermined length; and a fourth tuning stub positioned on the SCSI bus at a fifth predetermined distance from the third tuning stub and a sixth predetermined distance from a second one of the SCSI terminators on the second end of the SCSI bus and having a fourth predetermined length.

18. The computing system of claim 15, wherein:

the SCSI load stubs and tuning stubs reside on the backplane; and the SCSI terminators reside on a second board.

19. The computing system of claim 15, wherein the SCSI bus comprises a low voltage differential SCSI bus.

20. The computing system of claim 15, further comprising at least one of an external storage unit and a mass storage unit loading the SCSI bus.

21. The computing system of claim 15, wherein the computing system comprises at least one of a local area network, a wide area network, a system area network, an intranet, and a portion of the Internet.

22. The computing system of claim 15, wherein the computing system employs a client/server architecture or a peer-to-peer architecture.

23. A cluster storage unit, comprising:

a plurality of SCSI disk drives;

a plurality of RAID controllers;

a backplane; and a SCSI bus electrically interconnecting the SCSI disk drives and the RAID controllers across the backplane, the SCSI bus including:

a plurality of SCSI load stubs through which the SCSI bus electrically interconnects the SCSI disk drives and the RAID controllers;

a pair of SCSI terminators;

a plurality of traces electrically connecting the SCSI load stubs between the SCSI terminators; and a plurality of tuning stubs positioned at predetermined distances between each of the SCSI terminators and the SCSI load stubs electrically proximate thereto and having predetermined lengths.

24. The cluster storage unit of claim 23, wherein the plurality of tuning stubs include:

a first and a second tuning stub positioned at a first and a second predetermined distance, respectively, from a first one of the SCSI terminators and before SCSI connector electrically proximate the first one of the SCSI terminators and having first and second predetermined lengths, respectively; and a third and a fourth tuning stub positioned at a third and a fourth predetermined distance, respectively, from a second one of the SCSI terminators and having third and fourth predetermined lengths, respectively.

25. The cluster storage unit of claim 23, wherein the plurality of tuning stubs include:

a first tuning stub positioned on the SCSI bus at a first predetermined distance from an outermost load stub at a first end of the SCSI bus and having a first predetermined length;

a second tuning stub positioned on the SCSI bus at a second predetermined distance from the first tuning stub and a third predetermined distance from the a first one of the SCSI terminators at the first end of the SCSI bus and having a second predetermined length;

a third tuning stub positioned on the SCSI bus at a fourth predetermined distance from an outermost load stub at a second end of the SCSI bus and having a third predetermined length; and a fourth tuning stub positioned on the SCSI bus at a fifth predetermined distance from the third tuning stub and a sixth predetermined distance from a second one of the SCSI terminators on the second end of the SCSI bus and having a fourth predetermined length.

26. The cluster storage unit of claim 23, wherein the SCSI bus comprises a low voltage differential SCSI bus.

27. A computing system, comprising:

a cluster storage unit;

a plurality of SCSI disk drives;

a plurality of RAID controllers;

a backplane; and a SCSI bus electrically interconnecting the SCSI disk drives and the RAID controller across the backplane, the SCSI bus including:

a plurality of SCSI load stubs through which the SCSI bus electrically interconnects the SCSI disk drives and the RAID controllers;

a pair of SCSI terminators;

a plurality of traces electrically connecting the SCSI load stubs between the SCSI terminators; and a plurality of tuning stubs positioned at predetermined distances between each of the SCSI terminators and the SCSI load stubs electrically proximate thereto and having predetermined lengths; and at least other computing apparatus electrically communicating with the first computing apparatus, wherein the other computing apparatus is selected from the group consisting of a storage unit, a server, and a client.

28. The computing system of claim 27, wherein the plurality of tuning stubs include:

a first and second tuning stub positioned at a first and a second predetermined distance, respectively, from a first one of the SCSI terminators and before SCSI connector electrically proximate the first one of the SCSI terminators and having first and second predetermined lengths, respectively; and a third and a fourth tuning stub positioned at a third and a fourth predetermined distance, respectively, from a second one of the SCSI terminators and having third and fourth predetermined lengths, respectively.

29. The computing system of claim 27, wherein the plurality of tuning stubs include:

a first tuning stub positioned on the SCSI bus at a first predetermined distance from an outermost load stub at a first end of the SCSI bus and having a first predetermined length;

a second tuning stub positioned on the SCSI bus at a second predetermined distance from the first tuning stub and a third predetermined distance from the a first one of the SCSI terminators at the first end of the SCSI bus and having a second predetermined length;

a third tuning stub positioned on the SCSI bus at a fourth predetermined distance from an outermost load stub at a second end of the SCSI bus and having a third predetermined length; and a fourth tuning stub positioned on the SCSI bus at a fifth predetermined distance from the third tuning stub and a sixth predetermined distance from a second one of the SCSI terminators on the second end of the SCSI bus and having a fourth predetermined length.

30. The computing system of claim 27, further comprising at least one of an external storage unit and a mass storage unit loading the SCSI bus.

31. The computing system of claim 27, wherein the computing system comprises at least one of a local area network, a wide area network, a system area network, an intranet, and a portion of the Internet.

32. The computing system of claim 27, wherein the computing system employs a client/server architecture or a peer-to-peer architecture.

33. A SCSI bus, comprising:

a plurality of SCSI load stubs;

a pair of SCSI terminators;

a plurality of traces electrically connecting the SCSI load stubs between the SCSI terminators; and a plurality of tuning stubs positioned at predetermined locations on the plurality of traces and having predetermined lengths such that they are capable of filtering noise on the SCSI bus.

34. The SCSI bus of claim 33, wherein the plurality of tuning stubs include:

a first and a second tuning stub positioned at a first and a second predetermined distance, respectively, from a first one of the SCSI terminators and before SCSI connector electrically proximate the first one of the SCSI terminators and having first and second predetermined lengths, respectively; and a third and a fourth tuning stub positioned at a third and a fourth predetermined distance, respectively, from a second one of the SCSI terminators and having third and fourth predetermined lengths, respectively.

35. The SCSI bus of claim 33, wherein the plurality of tuning stubs include:

a first tuning stub positioned on the SCSI bus at a first predetermined distance from an outermost load stub at a first end of the SCSI bus and having a first predetermined length;

a second tuning stub positioned on the SCSI bus at a second predetermined distance from the first tuning stub and a third predetermined distance from the a first one of the SCSI terminators at the first end of the SCSI bus and having a second predetermined length;

a third tuning stub positioned on the SCSI bus at a fourth predetermined distance from an outermost load stub at a second end of the SCSI bus and having a third predetermined length; and a fourth tuning stub positioned on the SCSI bus at a fifth predetermined distance from the third tuning stub and a sixth predetermined distance from a second one of the SCSI terminators on the second end of the SCSI bus and having a fourth predetermined length.

36. The SCSI bus of claim 35, wherein at least one of:

the first predetermined distance equals the second predetermined distance;

the fourth predetermined distance equals the fifth predetermined distance; and the third predetermined distance equals the sixth predetermined distance.

37. The SCSI bus of claim 33, wherein:

the SCSI load stubs and tuning stubs reside on a first board; and the SCSI terminators reside on a second board.

38. The SCSI bus of claim 37, wherein the first board is a backplane.

39. The SCSI bus of claim 37, wherein the second board is a RAID controller.

40. The SCSI bus of claim 33, wherein the SCSI terminators comprise SCSI protocol chips.

41. The SCSI bus of claim 33, wherein the SCSI bus comprises a low voltage differential SCSI bus.

* * * * *